United States Patent [19]

Yach

[11] Patent Number: 5,793,684

[45] Date of Patent: Aug. 11, 1998

[54] MEMORY DEVICE HAVING SELECTABLE REDUNDANCY FOR HIGH ENDURANCE AND RELIABILITY AND METHOD THEREFOR

[75] Inventor: Randy L. Yach, Phoenix, Ariz.

[73] Assignee: Microchip Technology Incorporated, Chandler, Ariz.

[21] Appl. No.: 891,348

[22] Filed: Jul. 10, 1997

[51] Int. Cl.⁶ ........................................ G11C 7/00
[52] U.S. Cl. ............................. 365/200; 365/63
[58] Field of Search ........................ 365/200, 63

[56] References Cited

U.S. PATENT DOCUMENTS

| | | | |
|---|---|---|---|
| 4,807,191 | 2/1989 | Flannagan | 365/200 |
| 5,621,690 | 4/1997 | Jungroth et al. | 365/200 |
| 5,673,227 | 9/1997 | Engles et al. | 365/200 |
| 5,677,880 | 10/1997 | Horiguchi et al. | 365/200 |

*Primary Examiner*—Son T. Dinh
*Attorney, Agent, or Firm*—Harry M. Weiss; Jeffrey D. Moy; Harry M. Weiss & Associates, P.C.

[57] ABSTRACT

A memory device having selectable redundancy for maintaining high endurance and high reliability. The memory device has two memory arrays wherein both memory arrays have a plurality of address locations for storing data. A switching unit is used to removeably connect the address locations of the first memory array means to corresponding address locations of second memory array in order to produce a first memory array having redundant address locations. If high reliability and redundancy is not required, a signal may be sent to the switching unit to disconnect the address locations of the first memory array from the corresponding address locations of the second memory array means to produce a memory device having an increased amount of address locations for storing data as compared to the first memory array having redundant address locations.

18 Claims, 1 Drawing Sheet

5,793,684

MEMORY DEVICE HAVING SELECTABLE REDUNDANCY FOR HIGH ENDURANCE AND RELIABILITY AND METHOD THEREFOR

BACKGROUND OF THE INVENTION

1. Field of the Invention:

This invention relates generally to memory devices and, more specifically, to a memory device which will allow a user to select between redundant memory cells in order to maintain high reliability or an increased amount of memory space for storing larger amounts of information.

2. Description of the Prior Art:

Presently, memory devices such as Electrical Erasable Programmable Read Only Memory (EEPROM) devices are generally used for two purposes. One is for data storage and the second is for program memory. There are generally two different types of uses for a memory device if the memory device is used for data storage. One use is for the repeated storage of data that is reused numerous times while the product using the memory device is running. The second type of use is to store calibration or setup information. In general, calibration or setup information is used only a few times through out the life cycle of the product. Thus, the normal endurance level of a memory cell of a memory device storing a particular bit of calibration or set up data is far higher than the application requirements. However, in order to maintain high reliability on the endurance level of a memory device which is used to store data which is repeatedly accessed, redundant cells are required. Redundant cells are designed so that if one memory cell fails another memory cell will take over and provide the required data. Redundant memory cells can produce memory devices which have greater than one million erase/write cycles of endurance per redundant memory cell.

Providing memory devices with redundant memory cells is very expensive in that it doubles the physical area taken by the memory array. The problem with these types of memory devices is that many users do not require memory devices with redundant memory cells. These users would rather have memory devices with a larger amount of memory space for storing additional data.

Therefore, a need existed to provide a memory device which would have selectable redundancy. The memory device would allow the user who wants high endurance to select a memory array which would have redundant memory cells. If the user does not require high endurance, the user has the option of selecting a memory array which is much larger than the memory array which has redundant memory cells.

SUMMARY OF THE INVENTION

In accordance with one embodiment of the present invention, it is an object of this invention to provide an improved memory device.

It is another object of the present invention to provide an improved memory device which has selectable redundancy.

It is another object of the present invention to provide an improved memory device which has selectable redundancy which would allow a user who requires high endurance to select a memory array with redundant memory cells.

It is still another object of the present invention to provide an improved memory device which has selectable redundancy which would allow a user who does not require high endurance to select a memory array which is much larger than the memory array with redundant memory cells.

BRIEF DESCRIPTION OF THE PREFERRED EMBODIMENTS

In accordance with one embodiment of the present invention, a memory device having selectable redundancy for maintaining high endurance and reliability is disclosed. The memory device has first memory array means for storing data wherein the first memory array means comprises a plurality of address locations. Second memory array means are provided and are also used for storing data wherein the second memory array means is also comprised of a plurality of address locations. The second memory array means has at least one of the plurality of address locations removeably coupled to a corresponding address location of the first memory array means. Input/Output (I/O) decode means are coupled to the first memory array means and to the second memory array means for storing and retrieving the data to and from the first memory array means and the second memory array means. Switching means are coupled to the at least one of the plurality of address locations of the second memory array means removeably coupled to a corresponding address location of the first memory array means for allowing a user to connect the at least one of the plurality of address locations of the second memory array means to the corresponding address location of the first memory array means for producing at least one redundant address location for storing the data. The switching means also allows the user to disconnect the at least one of the plurality of address locations of the second memory array means from the corresponding address location of the first memory array means to increase a total number of address locations of the memory device for storing the data.

In accordance with another embodiment of the present invention, a method of providing a memory device having selectable endurance for maintaining high endurance and reliability is disclosed. The method comprises the steps of: providing first memory array means for storing data wherein the first memory array means comprises a plurality of address locations; providing second memory array means for storing data wherein the second memory array means comprises a plurality of address locations and having at least one of the plurality of address locations of the second memory array means removeably coupled to a corresponding address location of the first memory array means; providing I/O decode means coupled to the first memory array means and to the second memory array means for storing and retrieving the data to and from the first memory array means and the second memory array means; and providing switching means coupled to the at least one of the plurality of address locations of the second memory array means removeably coupled to the corresponding address location of the first memory array means for allowing a user to connect the at least one of the plurality of address locations of the second memory array means to the corresponding address location of the first memory array means for producing at least one redundant address location for storing the data and for allowing the user to disconnect the at least one of the plurality of address locations of the second memory array means from the corresponding address location of the first memory array means to increase a total number of address locations of the memory device for storing the data.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
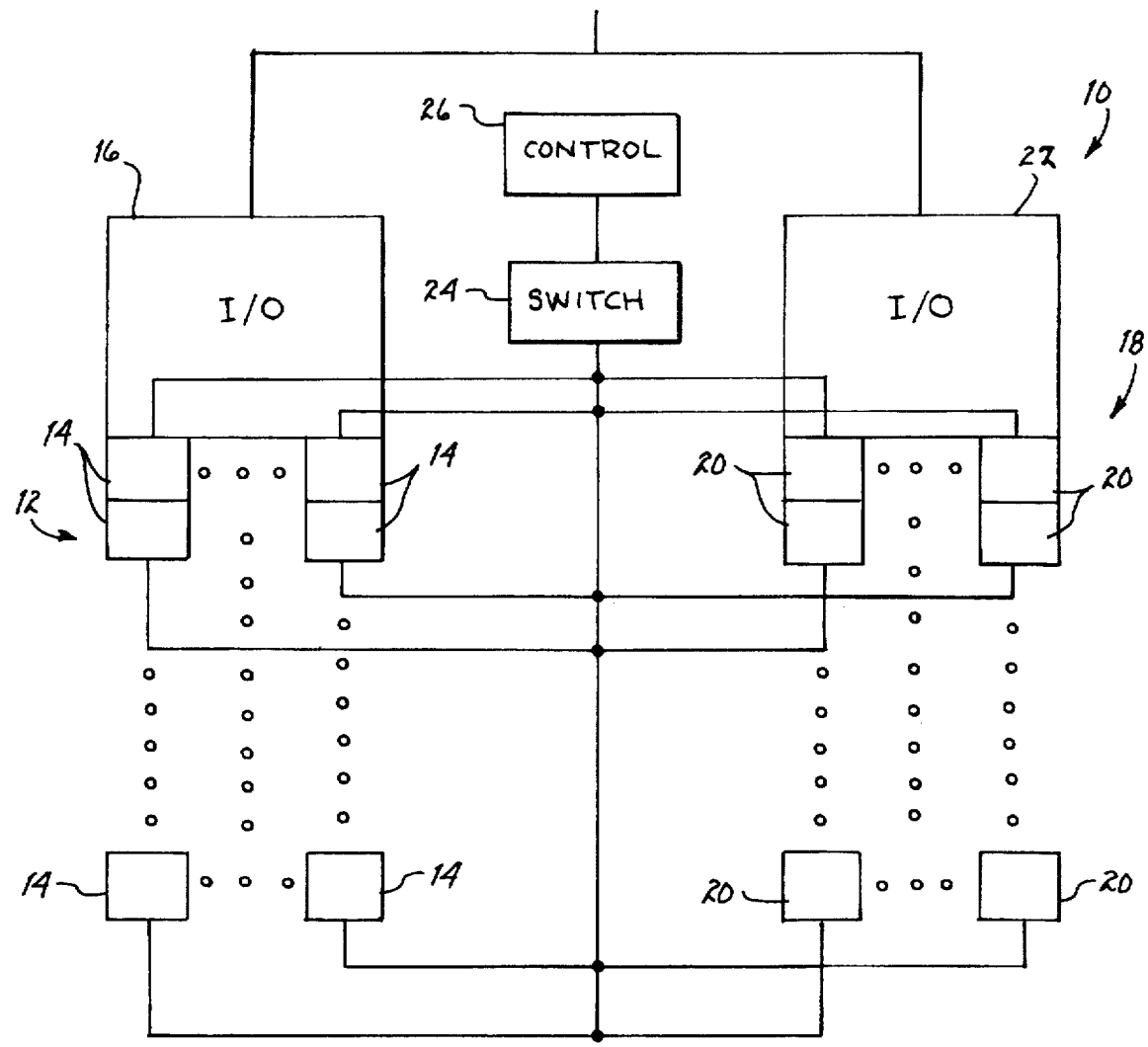
FIG. 1 is a simplified block diagram of the memory device having selectable redundancy for high endurance and reliability.

Referring to FIG. 1, a memory device having selectable redundancy for maintaining high endurance and high reliability 10 (hereinafter memory device 10) is shown. Preferably, the memory device 10 is used for storing some form of data. Some examples of data the memory device 10 may store includes, but is not limited to, program memory, repetitive access data which may be accessed from the memory device 10 numerous amounts of times through out the life cycle of the product using the memory device 10, and calibration or set up data.

The memory device 10 has a first memory array 12 which is used for storing the data. The first memory array 12 is comprised of a plurality of memory cells 14. Each of the memory cells 14 are used for storing individual bits of data. Each of the memory cells 14 of the first memory array 12 is defined by a unique address location.

An Input/Output (I/O) decode unit 16 is coupled to the first memory array 12. The I/O decode unit 16 is used for storing and retrieving data to and from the first memory array 12. The I/O decode unit 16 is able to decode a request for data and to retrieve the requested data from the proper address location of the first memory array 12. The I/O decode unit 16 is also able to decode a request to store the data and to store the data in the proper address location of the first memory array 12.

The memory device 10 is further comprised of a second memory array 18. The second memory array 18 is also used for storing data. The second memory array 18 is similar in structure to the first memory array 12. The second memory array 18 is comprised of a plurality of memory cells 20 for storing individual bits of data. Each of the memory cells 20 of the second memory array 18 have a unique address location which is used to define the position of the memory cells 20 in the second memory array 18.

Like the first memory array 12, the second memory array 18 has an I/O decode unit 22 coupled thereto. The I/O decode unit 22 functions in a similar manner to that of the I/O decode unit 16. The I/O decode unit 22 is used for storing and retrieving data to and from the second memory array 18. The I/O decode unit 22 is able to decode a request for data and to retrieve the requested data from the proper address location of the second memory array 18. The I/O decode unit 22 is also able to decode a request to store the data and to store the data in the proper address location of the second memory array 18.

In order to allow a user to have a first memory array 12 having memory cells 14 with redundancy, at least one memory cell 14 needs to be removeably coupled to a corresponding memory cell 20 of the second memory array 18. However, in the preferred embodiment of the present invention, all of the memory cells 14 of the first memory array 12 have redundancy. Thus, all of the memory cells 14 of the first memory array 12 are removeably coupled to separate and different corresponding memory cells 20 of the second memory array 18.

The memory device 10 uses a switching unit 24 to removeably coupled the memory cells 14 of the first memory array 12 to corresponding memory cells 20 of the second memory array 18. If high reliability and endurance is required, a signal can be sent to the switching unit 24 to connect the memory cells 14 of the first memory array 12 to corresponding memory cells 20 of the second memory array 18. By connecting the two sets of memory cells (i.e., memory cells 14 to corresponding memory cells 20) the user of the memory device 10 is able to have a memory device 10 having a first memory array 12 having a maximum of one hundred percent redundancy. If high reliability and endurance is not required, the user may signal the switching unit 24 to disconnect the memory cells 14 of the first memory array 12 from the memory cells 20 of the second memory array 18. By disconnecting the two sets of memory cells, a memory device 10 is created which has twice the storage space for storing data than the first memory array 12 having one hundred percent redundancy.

The switching unit 24 may further have a control unit 26 coupled thereto. The control unit 26 would be used for allowing the user to select how many of the memory cells 14 of the first memory array 12 would have redundant operation.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A memory device having selectable redundancy for maintaining high endurance and high reliability comprising, in combination:

first memory array means for storing data wherein said first memory array means comprises a plurality of address locations;

second memory array means for storing data wherein said second memory array means comprises a plurality of address locations and having at least one of said plurality of address locations of said second memory array means removeably coupled to a corresponding address location of said first memory array means;

Input/Output (I/O) decode means coupled to said first memory array means and to said second memory array means for storing and retrieving said data to and from said first memory array means and said second memory array means; and switching means coupled to said at least one of said plurality of address locations of said second memory array means removeably coupled to said corresponding address location of said first memory array means for allowing a user to connect said at least one of said plurality of address locations of said second memory array means to said corresponding address location of said first memory array means for producing at least one redundant address location for storing said data and for allowing said user to disconnect said at least one of said plurality of address locations of said second memory array means from said corresponding address location of said first memory array means to increase a total number of address locations of said memory device for storing said data.

2. A memory device in accordance with claim 1 wherein said first memory array means comprises a first plurality of memory cell means for storing said data wherein each of said first plurality of memory cell means have a different address location.

3. A memory device in accordance with claim 2 wherein said second memory array means comprises a second plurality of memory cell means for storing said data wherein each of said second plurality of memory cell means have a different address location.

4. A memory device in accordance with claim 1 wherein more than one of said plurality of address locations of said second memory array means are coupled to said switching means and removeably coupled to separate and different corresponding address locations of said first memory array means for producing more than one redundant address locations.

5. A memory device in accordance with claim 1 wherein all of said plurality of address locations of said second memory array means are coupled to said switching means and removeably coupled to separate and different corresponding address locations of said first memory array means for producing a plurality of redundant address locations.

6. A memory device in accordance with claim 5 wherein said plurality of address locations of said second memory array means is equal in number to said plurality of address locations of said first memory array means.

7. A memory device in accordance with claim 6 wherein said switching means allows said user to select at least one of one hundred percent redundancy of said first memory array means and memory array means for storing said data having double amount of address locations for storing said data as said first memory array means having said one hundred percent redundancy.

8. A memory device in accordance with claim 5 wherein said memory device further comprises control unit means coupled to said switching means for allowing said user to select a desire number of redundant address locations.

9. A memory device in accordance with claim 1 wherein said I/O decode means comprises:

first I/O decode unit means coupled to said first memory array means for storing and retrieving said data to and from said first memory array means; and second I/O decode unit means coupled to said second memory array means for storing and retrieving said data to and from said second memory array means.

10. A method of providing a memory device having selectable redundancy for maintaining high endurance and reliability comprising the steps of:

providing first memory array means for storing data wherein said first memory array means comprises a plurality of address locations;

providing second memory array means for storing data wherein said second memory array means comprises a plurality of address locations and having at least one of said plurality of address locations of said second memory array means removeably coupled to a corresponding address location of said first memory array means;

providing Input/Output (I/O) decode means coupled to said first memory array means and to said second memory array means for storing and retrieving said data to and from said first memory array means and said second memory array means; and providing switching means coupled to said at least one of said plurality of address locations of said second memory array means removeably coupled to said corresponding address location of said first memory array means for allowing a user to connect said at least one of said plurality of address locations of said second memory array means to said corresponding address location of said first memory array means for producing at least one redundant address location for storing said data and for allowing said user to disconnect said at least one of said plurality of address locations of said second memory array means from said corresponding address location of said first memory array means to increase a total number of address locations of said memory device for storing said data.

11. The method of claim 10 wherein said step of providing first memory array means further comprises the step of providing a first plurality of memory cell means for storing said data wherein each of said first plurality of memory cell means have a different address location.

12. The method of claim 11 wherein said step of providing second memory array means further comprises the step of providing a second plurality of memory cell means for storing said data wherein each of said second plurality of memory cell means have a different address location.

13. The method of claim 10 further comprising the step of coupling more than one of said plurality of address locations of said second memory array means to said switching means and removeably coupling said more than one of said plurality of address locations of said second memory array means to separate and different corresponding address locations of said first memory array means for producing more than one redundant address locations.

14. The method of claim 10 further comprising the step of coupling all of said plurality of address locations of said second memory array means to said switching means and removeably coupling all of said plurality of address locations of said second memory array means to separate and different corresponding address locations of said first memory array means for producing a plurality of redundant address locations.

15. The method of claim 14 wherein said plurality of address locations of said second memory array means is equal in number to said plurality of address locations of said first memory array means.

16. The method of claim 15 wherein said step of providing switching means further comprises the step of providing switching means which allows said user to select at least one of one hundred percent redundancy of said first memory array means and memory array means for storing said data having double amount of address locations for storing said data as said first memory array means having said one hundred percent redundancy.

17. The method of claim 14 further comprising the step of providing control unit means coupled to said switching means for allowing said user to select a desire number of redundant address locations.

18. The method of claim 10 wherein said step of providing I/O decode means further comprises the steps of:

providing first I/O decode unit means coupled to said first memory array means for storing and retrieving said data to and from said first memory array means; and providing second I/O decode unit means coupled to said second memory array means for storing and retrieving said data to and from said second memory array means.

* * * * *